United States Patent [19]
Morton

[11] Patent Number: 4,722,084
[45] Date of Patent: Jan. 26, 1988

[54] ARRAY RECONFIGURATION APPARATUS AND METHODS PARTICULARLY ADAPTED FOR USE WITH VERY LARGE SCALE INTEGRATED CIRCUITS

[75] Inventor: Steven G. Morton, Oxford, Conn.
[73] Assignee: ITT Corporation, New York, N.Y.
[21] Appl. No.: 782,850
[22] Filed: Oct. 2, 1985
[51] Int. Cl.⁴ .......................................... G06F 11/20
[52] U.S. Cl. ..................................... 371/9; 364/200; 371/11
[58] Field of Search ............... 371/9, 10, 11; 364/200, 364/900

[56] References Cited

U.S. PATENT DOCUMENTS

| | | | |
|---|---|---|---|
| 4,092,733 | 5/1978 | Coontz et al. | 371/10 X |
| 4,412,281 | 10/1983 | Works | 364/200 |
| 4,422,161 | 12/1983 | Kressel et al. | 371/10 X |
| 4,468,738 | 8/1984 | Hansen et al. | 364/200 |
| 4,507,726 | 3/1985 | Grinberg et al. | 364/200 |
| 4,523,313 | 6/1985 | Nibby, Jr. et al. | 371/10 |
| 4,566,102 | 1/1986 | Hefner | 371/11 |
| 4,577,294 | 3/1986 | Brown et al. | 371/10 X |
| 4,586,178 | 4/1986 | Boose | 371/10 |
| 4,592,024 | 5/1986 | Sakai et al. | 371/10 |
| 4,601,031 | 7/1986 | Walker et al. | 371/10 |

FOREIGN PATENT DOCUMENTS 1377859 12/1974 United Kingdom .

OTHER PUBLICATIONS

Masterson, Implementation of a Finite Impulse Response Digital Filter on the ITT Cellular Array Processor, Parallel Computing 85, Berlin, Sep. 23-25, 1985, pp. 1-5.
Mangels, ITT Unveils New Microchip, The Telegram, Feb. 1, 1985, p. 37.
Cellular Array Processing Gives Computers a New Approach, ITT Technology, vol. 1, No. 1, p. 3.
Batcher, Design of Massively Parallel Processor, IEEE Computer Society, 1980, pp. 80-85.
Cotton et al., Computation of the Discrete Fourier Transform on the Cellular Array Processor, Electrical Communication, vol. 59, No. 3, May 6, 1985, pp. 306-311.
Cotton, An Engineerable and Reconfigurable Cellular Array Processor, Parallel Computing 85, Berlin, Sep. 23-25, 1985, pp. 1-7.
Brooks et al., Yes, An SIMD Machine Can Be Used for AI, Ninth Intl. Joint Conf. on Artificial Intelligence, Aug. 18-23, 1985, pp. 73-79.
Parhami et al., A Study of Fault Tolerance Techniques for Associative Processors, National Computer Conference, 1974, pp. 645-652.
Kondo et al., An LSI Adaptive Array Processor, IEEE Journal of Solid State Circuits, Apr. 1983, pp. 147-155.
Chuan-Lin Wu, Multiprocessor Technology IEEE Computer, Jun. 1985, pp. 6-7.
Lerner, Parallel Processing Gets Down to Business, High Technology, Jul. 1985, pp. 20-28.

*Primary Examiner*—Charles E. Atkinson
*Attorney, Agent, or Firm*—T. L. Peterson

[57] ABSTRACT

An array reconfiguration apparatus is employed in large integrated circuits and large systems. The apparatus makes use of spare wires and/or computation elements which are incorporated in the array. The apparatus uses spare wires in place of defective wires and/or the apparatus uses spare computation elements in place of defective computation elements so that an operational system may be created in spite of the occurrence of numerous manufacturing or lifetime faults. The excess wires are utilized as data input and output lines and as such each data line is associated with a bidirectional buffer/receiver (B/R). The bidirectional B/R's are capable of transmitting data in either direction as from an input terminal to an output terminal or vice versa. Each data line is connected to a bidirectional multiplexing device which has a control input. Control logic means has dynamically stored therein the assignment of each significant wire and each computation element. Only unreliable wires as between integrated circuits are switchable. The control logic selects operational elements as well as operational data lines and hence uses the spare data lines to make connections between the redundant elements on the circuit board so that an array configuration can be implemented in spite of multiple defects on the overall circuit board. The invention further discloses a simple method for computing the assignments of cells and wires to avoid the defects.

22 Claims, 19 Drawing Figures

SIMPLIFIED ARRAY CHIP BLOCK DIAGRAM

SERIES CONNECTION OF MODULE WITH SPARE WIRES

PARALLEL CONNECTION OF MODULE WITH SPARE WIRES

RECONFIGURATION AROUND A BAD CELL

RECONFIGURATION AROUND A BAD WIRE

FIG. 5
RECONFIGURATION AROUND BAD CELLS AND A BAD WIRE
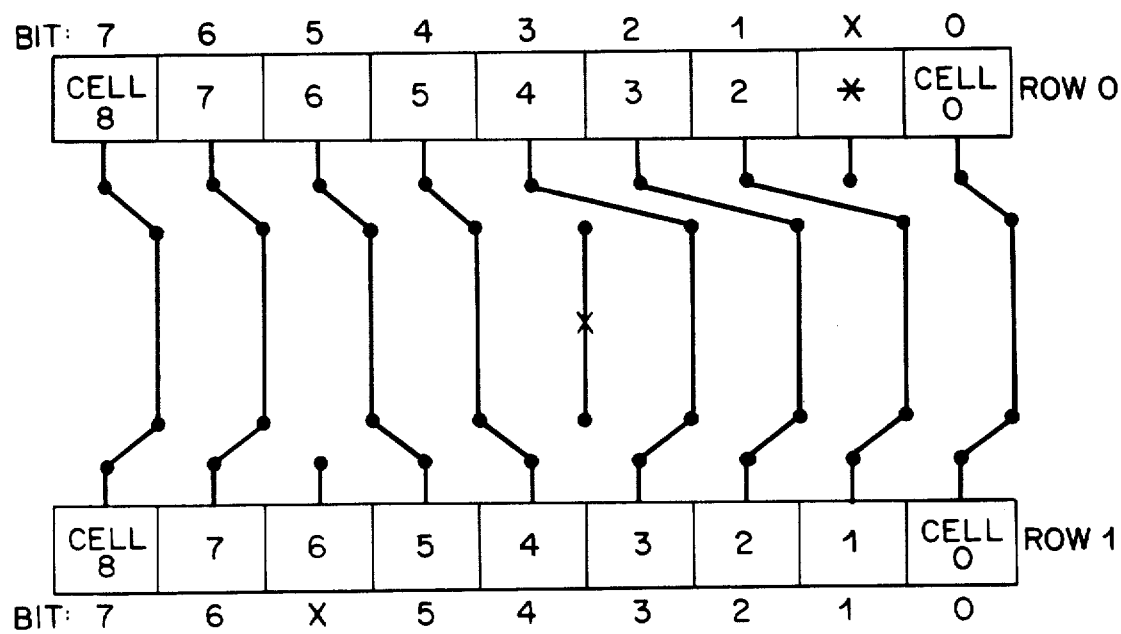
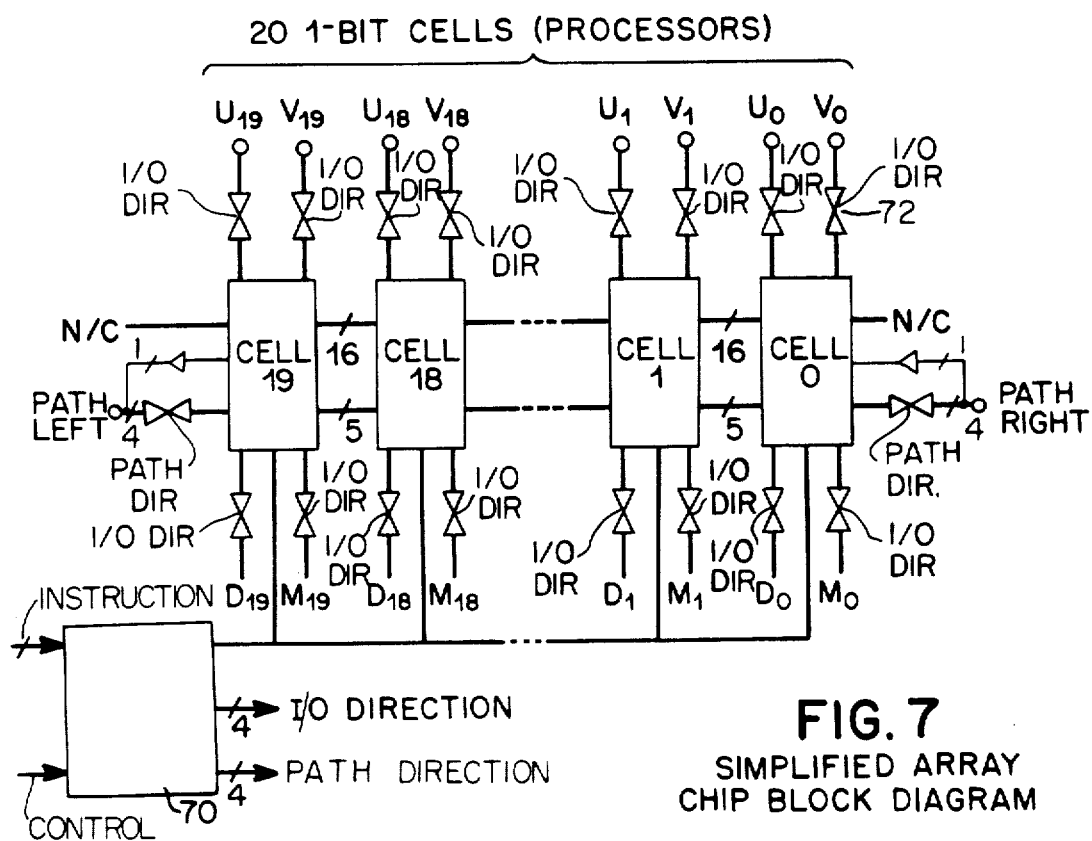
FIG. 7
SIMPLIFIED ARRAY CHIP BLOCK DIAGRAM

1 BIT CELL BLOCK DIAGRAM

COMMON CONTROL BLOCK DIAGRAM

BIMULTIPLEXER BLOCK DIAGRAM

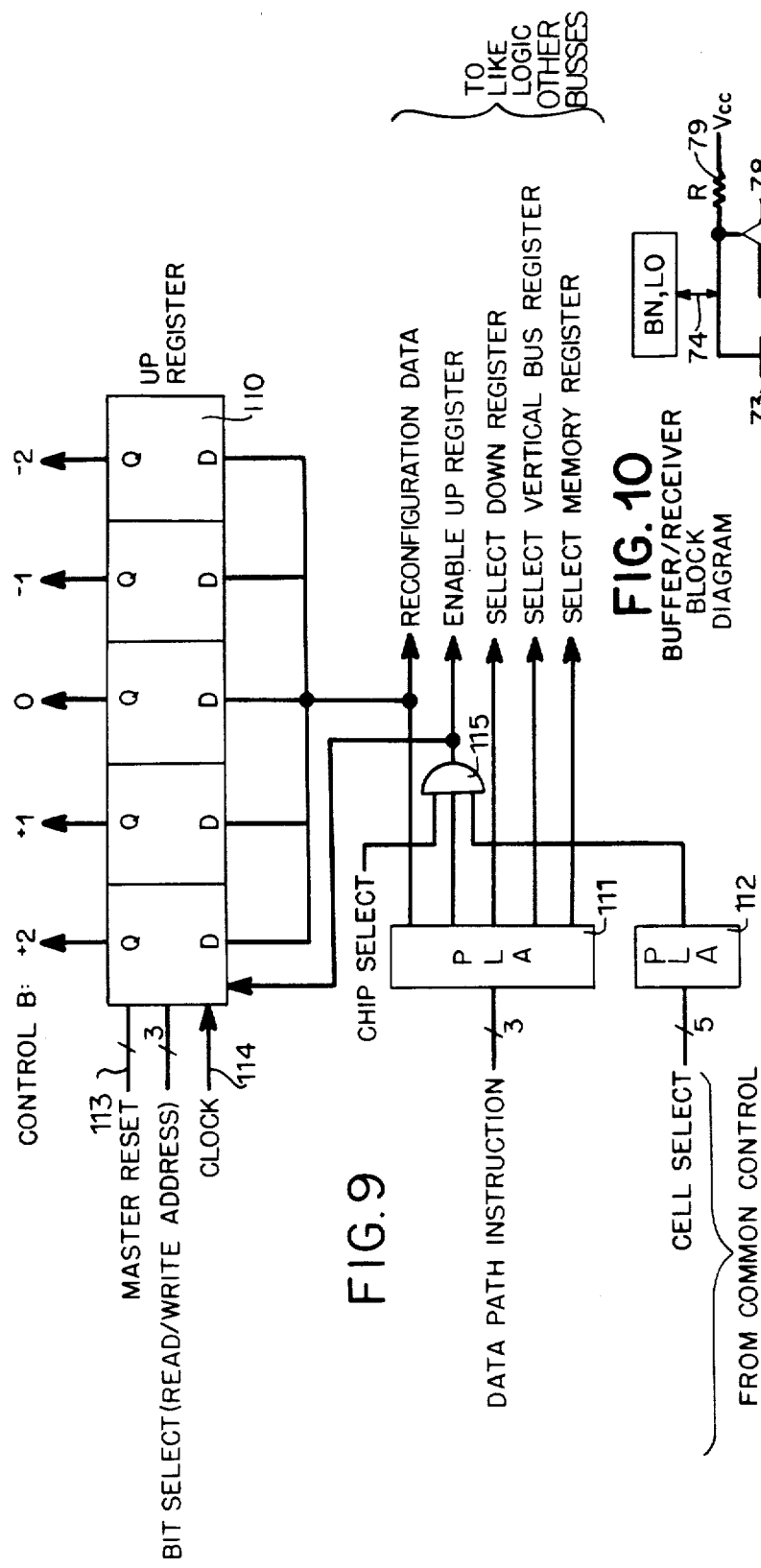
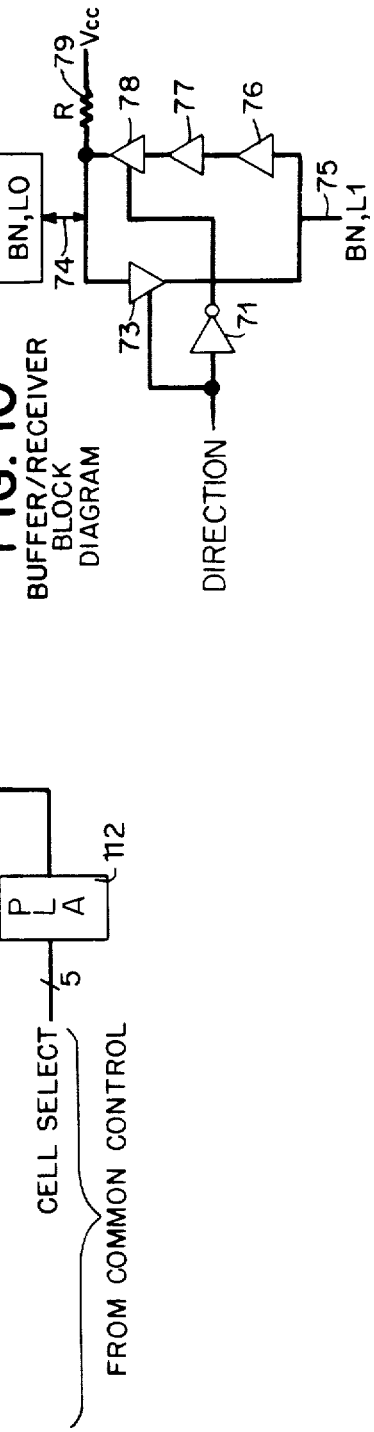
FIG. 9 UP BIMUX CONTROL LOGIC BLOCK DIAGRAM
FIG. 10 BUFFER/RECEIVER BLOCK DIAGRAM

INTERCONNECTED BIMUXES

FIG. 12 RECONFIGURATION AROUND A BAD CELL

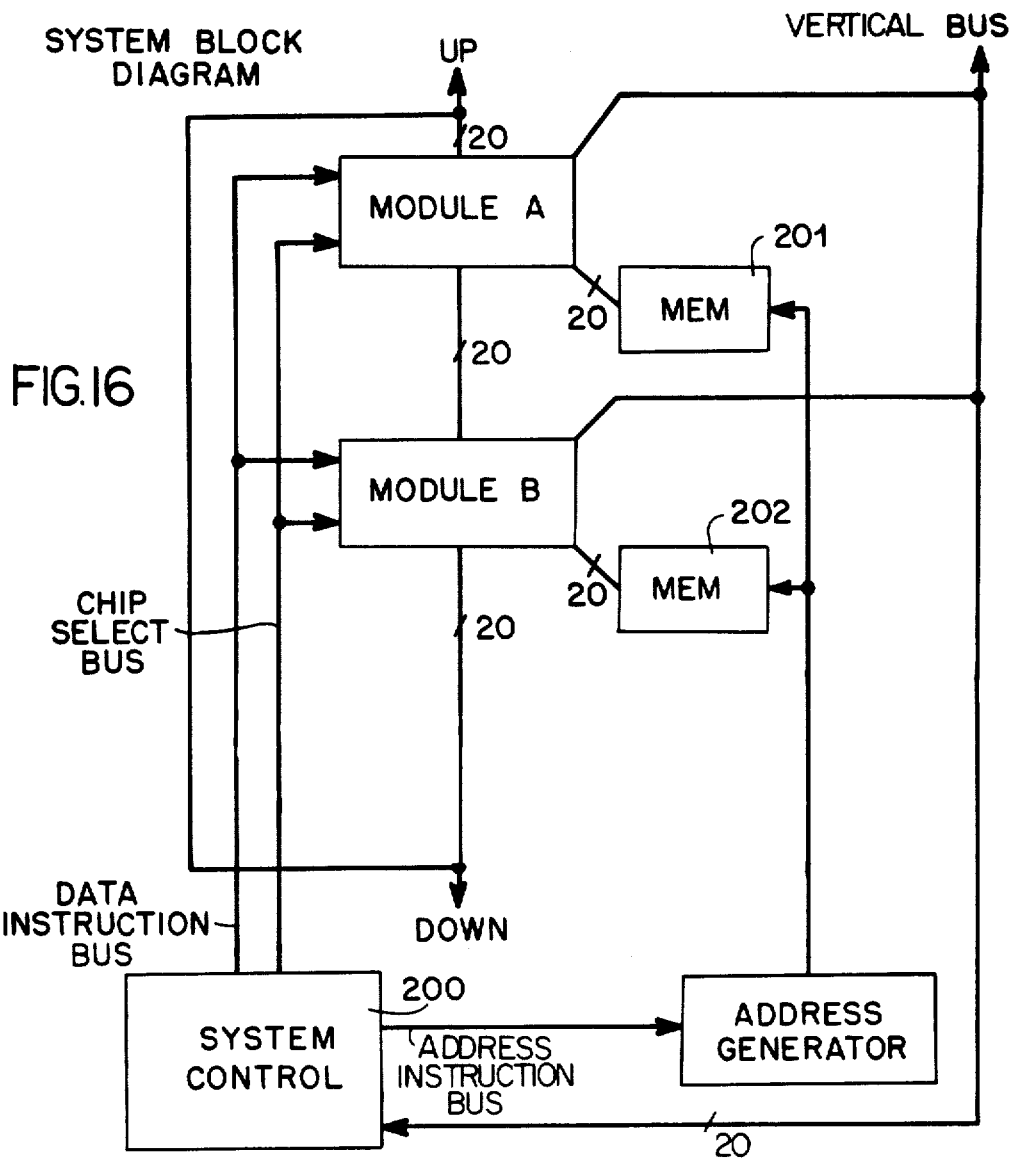
FIG. 16 SYSTEM BLOCK DIAGRAM
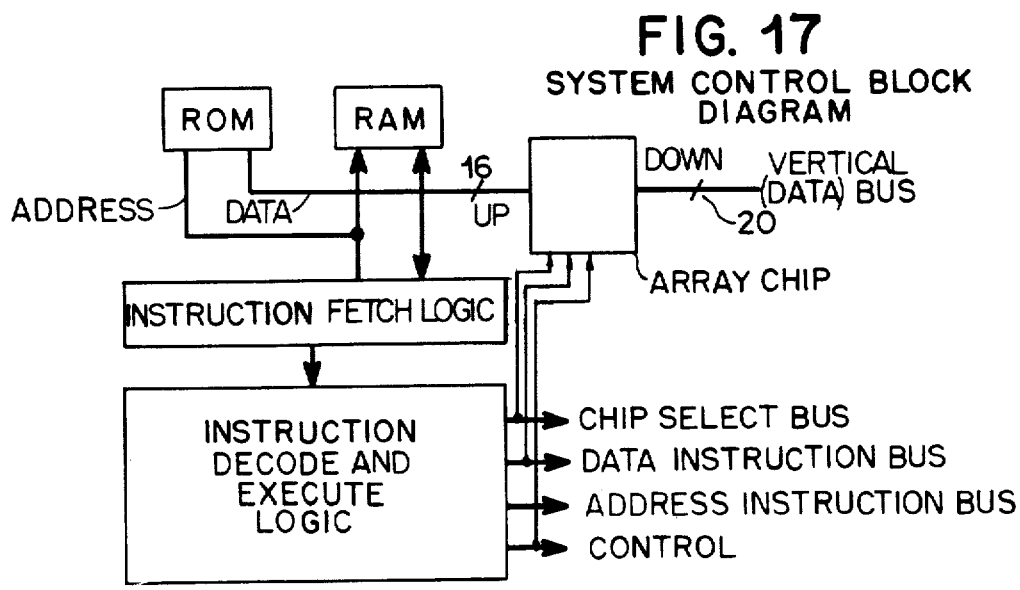
FIG. 17 SYSTEM CONTROL BLOCK DIAGRAM

FIG. 18
CELL/WIRE ASSIGNMENT TABLE

ARRAY RECONFIGURATION APPARATUS AND METHODS PARTICULARLY ADAPTED FOR USE WITH VERY LARGE SCALE INTEGRATED CIRCUITS

CROSS REFERENCE TO RELATED APPLICATIONS

Reference is hereby made to the following related U.S. Pat. Nos. 4,507,748, issued Mar. 26, 1985; 4,536,855, issued Aug. 20, 1985; 4,546,428, issued Oct. 8, 1985; and 4,580,215, issued Apr. 1, 1986. All four of the above mentioned patents are commonly assigned herewith.

Reference is hereby made to copending U.S. patent application Ser. No. 473,365 filed Mar. 8, 1983 which is commonly assigned herewith.

BACKGROUND OF THE INVENTION

This invention relates to reconfiguration apparatus and more particularly to such apparatus which will enable one to use very large scale integrated circuits in spite of faults which occur during fabrication or operation of the IC or circuit board containing those IC's.

The prior art is aware of the fact that many very large scale integrated (VLSI) circuits contain a number of repeated modules or circuit configurations which may operate in conjunction with one another to produce a desired result. The VLSI chip may be extremely complicated and contain hundreds of thousands of components which operate in conjunction with one another. As such, certain VLSI devices are employed to perform complicated mathematical processing, and hence many of the circuit components are similar in construction and configuration, especially in so called parallel processors, and operate in concert to speed the processing of data. In any event, as the size of the chip increases, the yield decreases. Thus, as the chip gets larger and more complicated, the likelihood that a given VLSI chip will be fully functional decreases. Thus, it is impractical to furnish very complex chips on a mass production basis.

As indicated, an example of the type of circuitry which would be implemented by VLSI techniques is the so-called parallel processor. Such processors operate upon parallel data streams under control of a single instruction, such as vector add or vector multiply. The processor may consist of a rectangular array of like single bit components, or cells, many of which are implemented in a single chip. The cells may cooperate to form words of varying size and can communicate in all four directions as right, left, up and down with their neighbors and can also communicate with external devices, such as memory, for input and output. Hence the processors can be applied to problems requiring matrix arithmetic, as found in image processing, pattern recognition, as well as engineering analysis.

These devices can perform fixed point and floating point arithmetic. The calculating ability of the processor is dependent upon the size of the array, the clock rate, the word size and the fraction of the array which is enabled for a particular operation. For example, a 128 cell $\times$ 128 cell array operating as 2048 8-bit processors simultaneously using a 10 MHz clock is estimated to achieve on the order of 20 billion additions or logical operations per second and on the order of 2.5 billion multiplications per second.

A special case of a parallel processor is the associative processor which generally performs only search operations. Associative processors are sometimes referred to as content addressable memories and are generally well known. See for example, U.S. Pat. No. 4,010,452 entitled ASSOCIATIVE DATA PROCESSING APPARATUS AND METHOD issued Mar. 1, 1977 to J. Cazanove. See also U.S. Pat. No. 4,296,475 entitled WORD RECOGNITION CONTENT ADDRESSABLE MEMORY issued on Oct. 20, 1981 to L. Nederlof et al.

There are many patents as well as technical articles which describe such arrays. See IEEE COMPUTER, June 1985, "Parallel Processor Programs in the Federal Government" (pages 43 to 56). See especially page 52 concerning the MPP.

In any event, as indicated above, there is a substantial problem in integrating such array chips in VLSI techniques due to the fact that as the chips become larger, providing more cells or more complex cells, the chip yield, based on current fabrication techniques, decreases. In addition, the more such chips are connected together, the greater is the likelihood that a chip failure will cause the loss of much or all of the system.

It is, therefore, an object of the present invention to enable one to utilize a plurality of integrated circuits in spite of the fact that these chips contain faults and to improve the reliability of systems containing large numbers of these chips.

According to this invention, the array configuration apparatus to be described enables a certain class of fault tolerant structures to be used after fabrication. There is provided means wherein two major classes of faults may be excluded so that the proper operation of the system may proceed following the occurrence, detection and location of a fault. The first class of faults is defective wiring which may occur between portions of the system. These defects such as open or shorted connections may occur at the time of system manufacture or may occur during the operating life of the system.

These defects commonly occur between distinct mechanical structures such as printed circuit boards or integrated circuit packages but may also occur between logical blocks on a single integrated circuit chip. Such multiple defects may also be corrected by this invention.

The second class of defects is defective logic blocks. When collections of blocks are connected together such as the cells in a parallel processor, defects may occur in one or more of these blocks. In order to localize the effect of the defect, it may be necessary to dynamically avoid the defect in order to restore operation of the system, and thus this restructuring or reconfiguration must be done without affecting the system or programming in general except during a brief repair interval. This invention, as will be explained, is particularly adapted for arrays of single bit processors. In this case, a small percentage, typically 25 percent, of spare parts, may be provided which, as will be explained, dramatically improves system reliability.

A few wires may be considered to be spare parts and the control of these wires may be integrated into the array of processors, in which case the control is fault tolerant if the processors are fault tolerant. Under the present state of the art, there is no fine grain, dynamically controllable repair means in existence. Prior art techniques use means of verifying data transferred such as encoding the data or providing one or more parity bits. An error correction code typically allows a single bit error to be corrected. But, the encoding is efficient only on relatively large words, such as 16-bits, whereas according to the methods and apparatus of this invention, one is concerned with single bits but may also correct multiple errors. An error correction code would presumably instantaneously correct the error. However, there are no means to correct multiple errors as can be corrected by the array reconfiguration apparatus according to this invention.

BRIEF DESCRIPTION OF THE PREFERRED EMBODIMENT

An array reconfiguration apparatus is employed in large integrated circuits and large systems. The apparatus makes use of spare wires and/or computation elements which are incorporated in the array. The apparatus uses spare wires in place of defective wires and/or the apparatus uses spare computation elements so that an operational system may be created in spite of the occurrence of numerous manufacturing or lifetime faults. The spare wires are utilized as data input and output lines and as such each data line is associated with a bidirectional buffer/receiver (B/R). The bidirectional B/R's are capable of transmitting data in either direction as from an input terminal to an output terminal or vice versa. Each data line is connected to a bidirectional multiplexing device (BIMUX) which has a control input. Control logic means has dynamically stored therein, as opposed to time-of-manufacture only, the assignment of each significant wire to a computation element. Only unreliable wires as between integrated circuits are switchable. The control logic selects an operational element which may have been a spare element, as well as an operational data line, which may have been a spare data line, to make a connection to a circuit board. The receiving circuit likewise makes a set of connections. Thus, an array configuration can be implemented in spite of multiple defects on the circuit board and on the chips it contains. The invention provides a simple method for computing the assignment of cells and wires to avoid the defects.

BRIEF DESCRIPTION OF THE FIGURES

FIG. 5 is a simplified block diagram showing an array reconfiguration around bad cells and a bad wire.

FIG. 7 is a simplified block diagram of an array chip used in this invention.

FIG. 9 is a block diagram showing the control logic for the BIMUX.

FIG. 10 is a circuit diagram depicting a buffer/receiver used in this invention.

FIG. 16 is a block diagram depicting system operation for an associative processor array.

FIG. 17 is a block diagram of the system control.

FIG. 18 is a cell/pin assignment table.

DETAILED DESCRIPTION OF THE INVENTION

Figure 1:
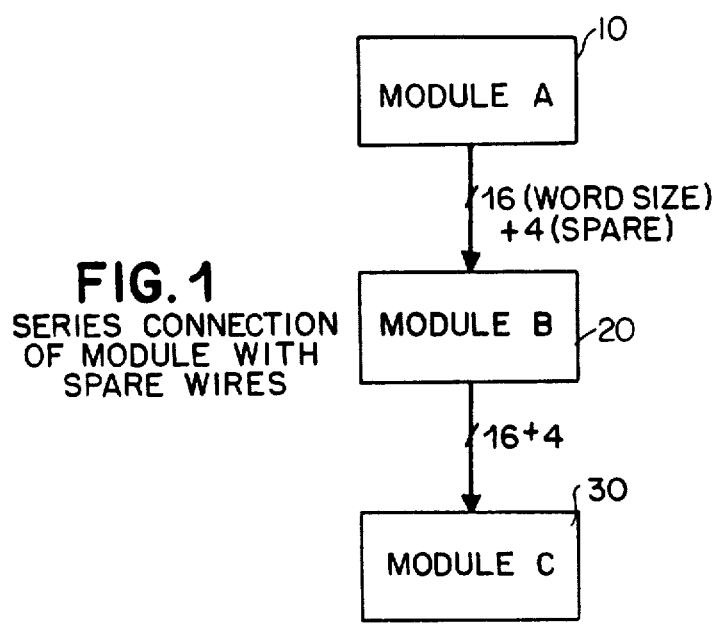
FIG. 1 is a simplified block diagram showing the series connection of modules utilizing spare wires according to this invention.

FIG. 1 shows a simple series interconnection block diagram according to this invention.

In FIG. 1 module 10 designated as module A, is connected to module 20 or module B by 20 wires. In turn, module B is connected to module C by 20 wires. Sixteen of these wires are the minimum requirement for a 16-bit word and four spare wires are added to handle various defects. The choice of sixteen and four is by way of example only and other combinations are possible. Essentially, the simple block diagram of FIG. 1 depicts a series connection of modules including four spare wires which as will be explained are utilized to bypass defective wires or components.

Figure 2:
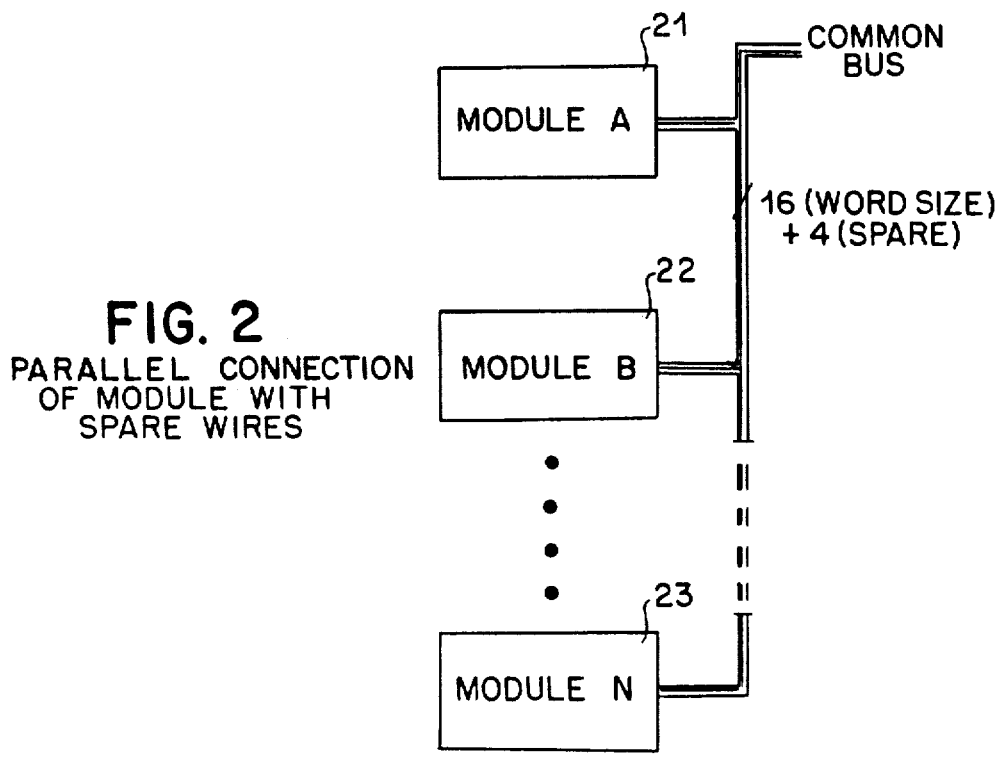
FIG. 2 is a simplified block diagram showing the parallel connection of multiple modules connected on a common bus employing spare wires according to this invention.

FIG. 2 shows a plurality of modules as 21, 22, and 23 respectively designated as A, B, and N and all connected on a common bus. FIG. 2 depicts the parallel connections of modules with spare wires. Again, the common bus constitutes 20 wires. Sixteen are employed to accommodate a 16-bit word and four wires are utilized as spares. Pursuant to this invention, control for the systems depicted in FIGS. 1 and 2 is simplified if failures in a given module do not affect other modules. Localization of the impact of a defect significantly reduces the problems in building operative systems.

Figure 3:
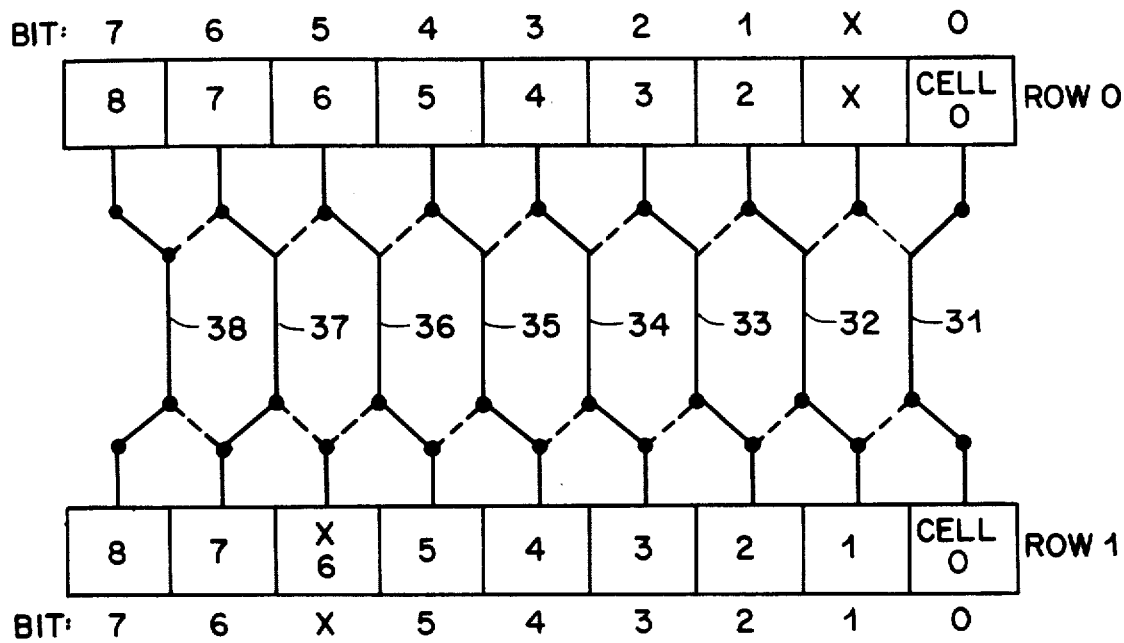
FIG. 3 is a simplified block diagram of an array reconfiguration around a bad cell.

FIG. 3 shows a reconfiguration scheme which is useful in explaining the bypassing of bad cells. The term, cell, is used in a generic sense and the cell may be a 1-bit processor or other integrated circuit configuration which employs a plurality of components. As seen in FIG. 3, row 0 consists of nine cells each indicative of a particular information bit as bits 0 through 7. As one can ascertain, there are nine cells in row 0, while the system requires the coupling of eight bits of information or actually requires eight operative cells. In a similar manner, row 1 contains nine cells as well. To interconnect the cells from row 0 to row 1, there are included eight wires designated as 31 through 38. For present purposes all wires are assumed to be operational.

FIG. 3 indicates the presence of a defective cell by the letter X. As one can see from FIG. 3, the second cell from the right which would normally accommodate bit 1 is defective in row 0. In row 1, the third cell from the left which normally would accommodate bit 6 is also defective.

In order to utilize only good cells, one requires means to connect good cells in row 0 to good cells in row 1. The ability of each good cell to be routed to one of two cells enables good cells to communicate with good cells, where the bit weight of each of the two cells is identical. As will be explained, according to this invention, the output of a cell can be connected to given wires associated with that cell. Hence, as shown in FIG. 3, cell 0 of row 0 is connected to cell 0 or row 1 via wire 31. Cell 1 of row 0 is defective (X) and hence, as seen in the diagram, is not connected to any cell in row 1.

However, cell 2 in row 0 which is a good cell is connected via wire 32 to cell 1 in row 1. The dashed lines indicate that the outputs of the various cells can be connected to either the right or left wires as 31 through 38 associated with the cells. Thus, as seen from FIG. 3, cell 6 of row 1 is a defective cell is disconnected. The system therefore connects cell 6 of row 0 via wire 36 to cell 5 of row 1. Thus, as seen from FIG. 3, the good cells accommodate the bits designated as 0 to 7 by connecting good cells to good cells between successive rows. As one can see from FIG. 3, the bit weight of a cell depends upon where the bad cell is located to its right. For example, bit 5 is accommodated by cell 6 in row 0 and by cell 5 in row 1.

Figure 4:
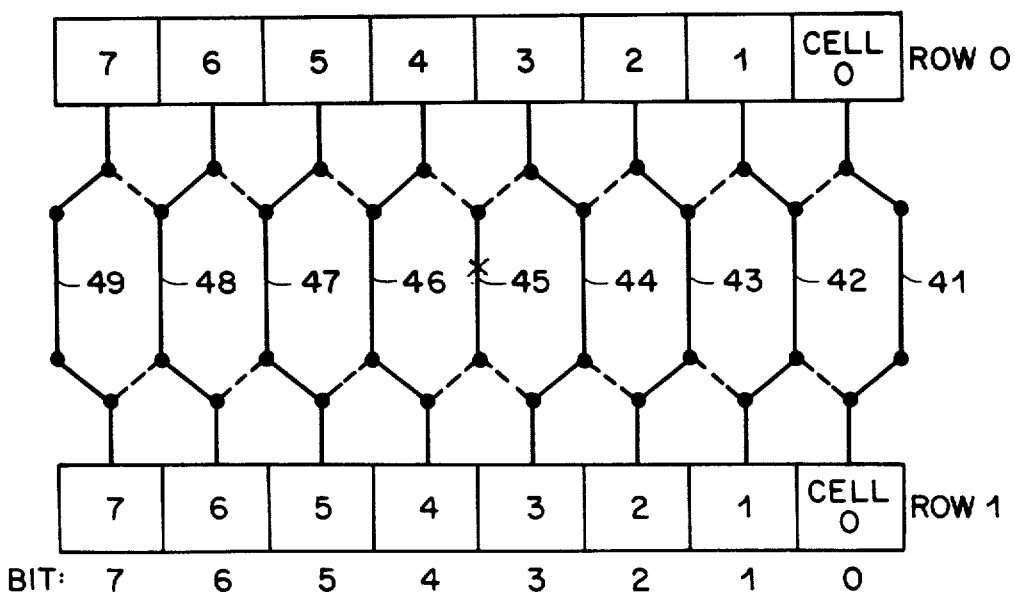
FIG. 4 is a simplified block diagram showing an array reconfiguration around a bad wire.

FIG. 4 shows a reconfiguration employed by this system which is utilized to circumvent or bypass a bad wire. Again, there exist two rows of cells designated as row 0 and row 1. Each row contains eight cells to accommodate bits 0 to 7. The cells can be connected to one another via wires 41 to 49. In this case, there are nine wires where eight are required for the connection of bits 0 to 7. As is seen from FIG. 4, wire 45 is defective and cannot be utilized. Hence, the system connects cells 0 to 3 of row 0 to cells 0–3 of row 1 via wires 41 to 44 and connects cells 4 to 7 of row 0 to cells 4 to 7 of row 1 via wires 46 to 49. Wire 45 which is a defective wire is bypassed and is not utilized by the system.

The ability of each cell to select one of two wires facilitates the bypassing of the defective wire 45 as shown in FIG. 4.

FIG. 5 shows reconfiguration around bad cells and a bad wire. In FIG. 5 there are nine cells (0–8) in row 0 and nine cells (0–8) in row 1. There are also nine wires between row 0 and row 1 which can provide interconnections between the cells. As seen from FIG. 5, cell 6 of row 1 is defective, and hence no connection is made to this cell. Thus, cell 6 of row 0 is connected to cell 5 of row 1 and so on. As one can ascertain from FIGS. 2 to 5, a more complex system can be accommodated which may have additional spare cells and wires. With the ability of each cell to be connected to a different wire, one can now provide an operational configuration even when multiple adjacent failures occur.

Figure 6:
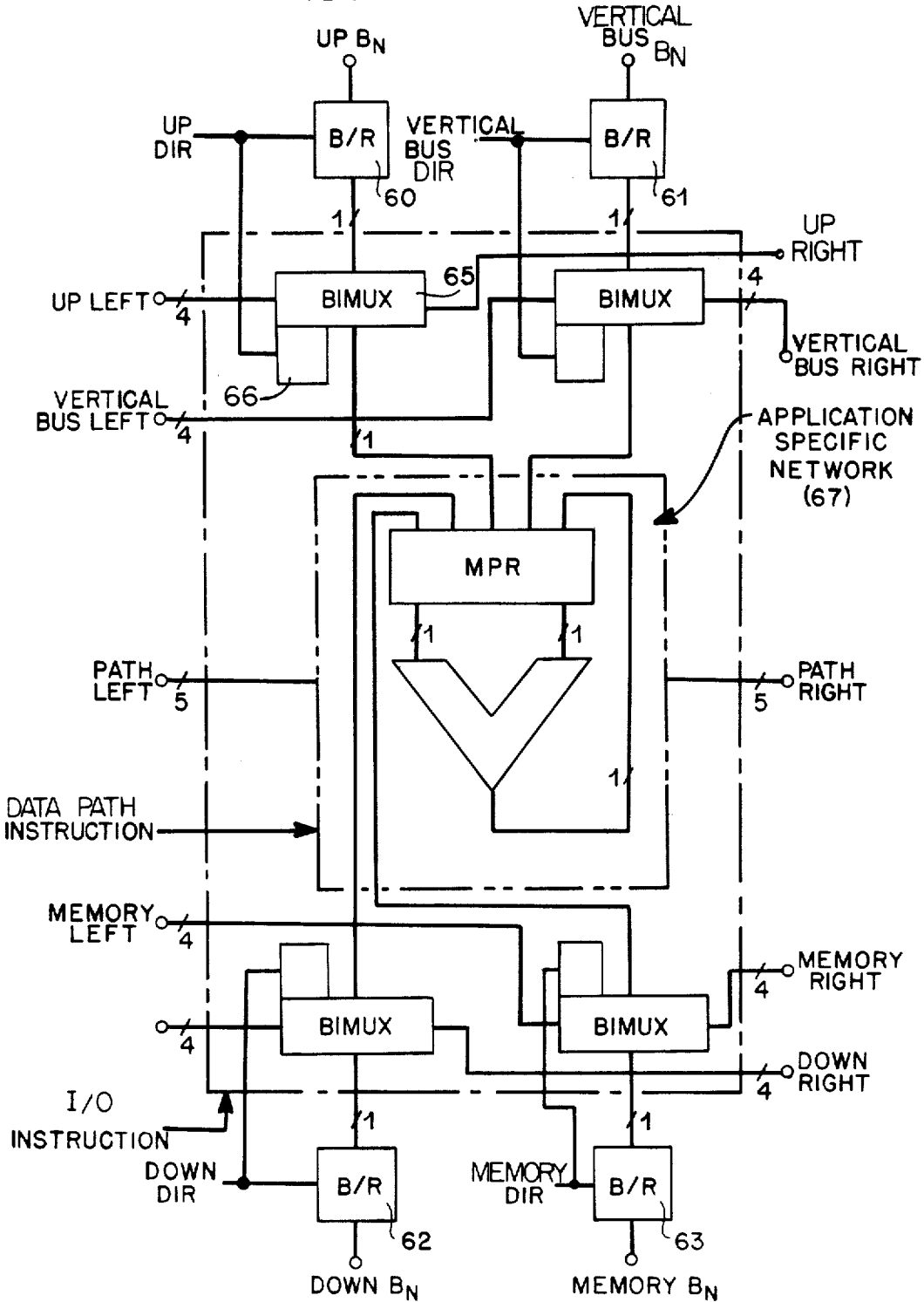
FIG. 6 is a detailed block diagram of a 1-bit processor according to this invention.

FIG. 6 shows the data path block diagram of a 1-bit processor cell. This 1-bit processor cell is the type of cell replicated in each row as indicated in conjunction with FIGS. 2 to 5. Each cell is associated with four bidirectional buffer/receivers (B/R's) designated as 60 to 63. The B/R's allow each cell to communicate on four separate reconfigurable paths designated as Up, Vertical Bus, Down and Memory. The operation of these four B/R's is logically the same, but the assignment of wires to a cell differs depending upon the occurrence of the cell and wire faults.

As seen in FIG. 6, each B/R as 60 to 63 is associated with a bimultiplexer (BIMUX) circuit which operates according to an associated control logic circuit. Thus, B/R 60 has a data lead directed to the BIMUX 65 which BIMUX is controlled by the control 66. The BIMUX, as will be explained, can couple the MPR data lead to any one of five selectable B/R's. Thus, the BIMUX can operate to allow good cells to communicate between two chips. The object of the reconfiguration means is to allow good cells to communicate where the choice of a wire for communication is isolated from the choice of a cell. Good cells may communicate with other cells or other devices such as memory. This isolation greatly facilitates the fabrication of complex systems by allowing the use of partially defective components, since perfect components may be unavailable or prohibitively expensive and further allows the dynamic repair of defects that occur during the life of the system.

FIG. 7 shows a simplified block diagram of a typical array chip. This array chip contains 20 cells each of the same configuration as shown in FIG. 6. The cells are designated as cells 0 to 19. The chip further includes common control 70. Thus as shown in FIG. 7, there are 20 1-bit processor cells arranged on the chip where each processor cell can be selected by the common control for initialization. Only 16 of the 20 cells need be fully functional in order to accommodate a 16-bit word.

The common control logic 70 consists of a pipeline register and buffers to speed the flow of instruction bits and control signals through an array chip. See FIG. 7A. The function of the PLA 102 is to partially decode the I/O Instructions, which move data on the Up, Down, Vertical Bus, and Memory pins. The partial decoding is necessary so that an output buffer may be turned on when a signal is flowing out of the array chip. The function of the PLA 103 is likewise for the Data Path Instructions, which affect the Path Left and Path Right signals.

The cell configuration depicted in FIG. 7 shows data lines as the data lines designated in FIG. 6 whereby each data line is associated with a B/R and its respective BIMUX and control. Thus, the data lines for cell 0 are designated as $U_o$, $V_o$, $D_o$ and $M_o$. Each of these data lines is associated with a B/R and designated as 72 for data line $V_o$ of cell 0. The pictorial representation 72 depicted for the B/R is utilized in conjunction with each of the data lines shown in FIG. 7.

As can be seen from FIG. 6, the four neighboring left and right connections to the BIMUX's 65 are made for each of the four data paths such as Up, Down, Vertical Bus, and Memory. As seen in the diagram of FIG. 7, there are 16 lines connecting cell 1 to cell 0 for pin reconfiguration. An additional five path lines provide cell reconfiguration as described in the aforementioned U.S. patent application, Ser. No. 473,362, filed Mar. 8, 1983. The former 16 lines, as will be explained, provide a number of spare connections which are selected based upon failures of cells and physical connections. The example further assumes a certain locality of interconnections. For example, a single wire may be connected to any one of five adjacent 1-bit processors, or inversely, a single 1-bit processor may be connected to any one of five adjacent wires. The five path lines represent one of many means for interconnecting the application, specific networks, as 67, in FIG. 6. This network typically performs the common operations of ADD, SUBTRACT, AND, OR as are found in many processors.

Each processor as cell 0 to cell 19 has four B/R's as shown in FIG. 6, and thus may connect to 1 wire in each of four groups of signals. The B/R's are provided to send and receive signals across the module boundaries. Data paths are provided to connect signals to or from good wires to good 1-bit processors. These data paths are fault tolerant, being incorporated into each 1-bit processor rather than being a central source. Because of this, a single defect, while necessitating reconfiguration, would not impair any processor. The data paths which by way of example are shown as four wide in FIG. 6 are connected through the BIMUX as 65 which is associated with B/R 60. The BIMUX control logic of FIG. 9 is provided to select which wire is connected to one 1-bit processor. This control logic is implemented in each 1-bit processor so that multiple 1-bit processors are not affected by a single fault.

Figure 7A:
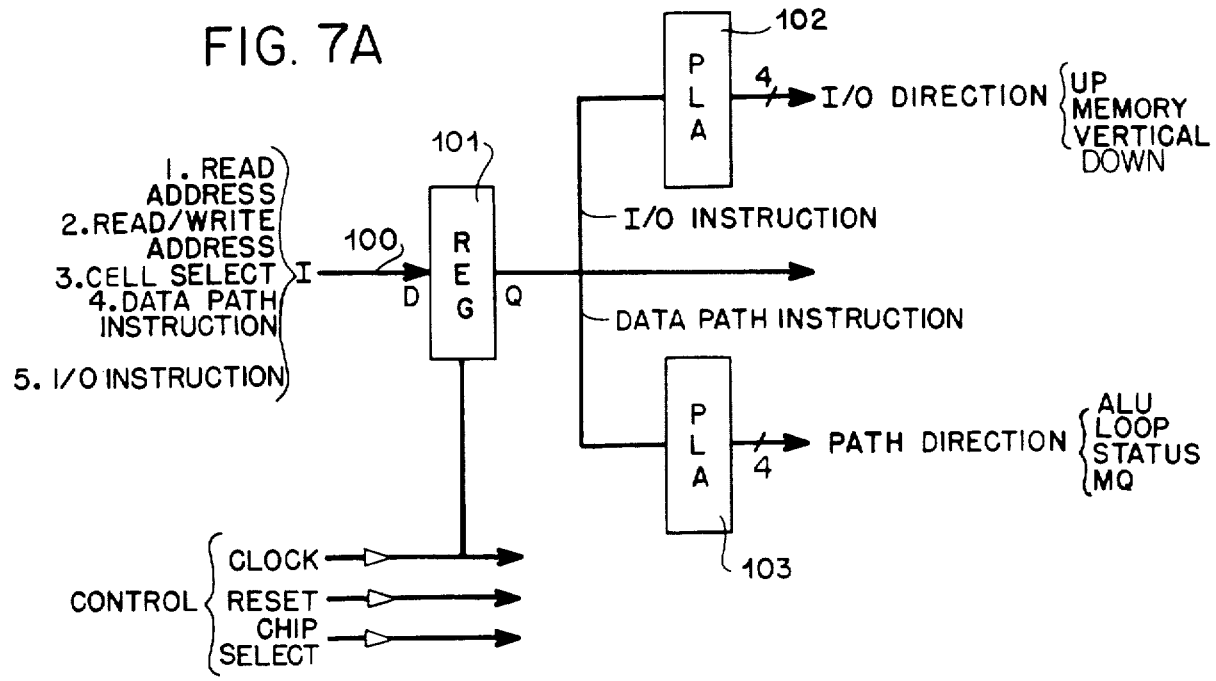
FIG. 7A is a block diagram of the common control.

Referring to FIG. 7A, there is shown in more detail the control logic depicted in FIG. 7 by numeral 70. The control logic essentially consists of an Instruction Bus 100 which is coupled to a storage register 101. The Instruction Bus receives the read address, the read/write address, the cell select signal, the data path instruction, the input/output instructions from an external control sequencer. This information is stored in the register, which also receives a clock input, which is the system clock. The output of the register is directed to a programmable logic array (PLA) 102 whose function is to process input/output instruction data, and therefore, to determine the direction of dataflow as to apply this information to the up, down, memory, and vertical buses. The programmable logic array or PLA 103 receives data path instruction. This instruction is indicative of data path direction and essentially is applied to the arithmetic logic unit, or ALU, which is part and parcel of the structure of each processor cell. Thus by again referring to FIG. 6, there is shown centrally located and designated as an application specific network. This module so designated includes an arithmetic logic unit, or ALU, as well as various registers. As can be seen from FIG. 6, inputs to the module are indicated as up right, vertical bus right, path right, memory right, down right, down left, memory left, path left, vertical bus left, and up left as well as up direction, down direction, memory direction, vertical bus direction, and so on. These lines are those lines which are controlled by PLA 102 and PLA 103. In this manner, the PLA devices can control the path direction or data direction in each individual processor cell. This therefore enables the selective transmission of data through the array according to the control specified by the Instruction.

FIG. 10 depicts a B/R module, as for example the modules 60 to 63 of FIG. 6. The input/output control line (DIRECTION) is applied to the input of an inverter 71 and to the enable of a buffer 73. The buffer 73 has its input coupled to the chip pin 74 with its output coupled to the B(N, L1) (bit (N, Level 1)) data line 75. The output data line is coupled through a series of buffers of increasing strength as 76, 77 and 78 to the chip pin 74 and is coupled to pull up resistor 79 to provide a known logic level in the event a bonding wire or external wire is broken. The B(N,L1) signal, as shown, is the signal to or from a BIMUX in a 1-bit processor. As one can see, an input signal will be transferred via buffer 73 to terminal 75 if DIRECTION is true.

An output signal will be transferred via buffers 76 to 78 to terminal 74, B(N,L0) if DIRECTION is false. Hence, the buffer and receiver circuit (B/R) operates as a bidirectional circuit, and data can be bidirectionally transmitted or received from input terminal 74 to output terminal 75 or vice versa. The number of buffers as 76, 77 and 78 are shown as three by way of example only, and this number is a function of the drive capability required.

It is, of course, understood that the relative number of 1-bit processors and wires depends upon the relative yield and reliability of the 1-bit processors and the wires. If wires are less reliable than 1-bit processors then more wires may be provided. For example, assuming that each B/R is connected to a bonding pad, then in order to minimize the number of package pins, not all bonding pads may be connected to package pins. In this manner when the number of 1-bit processors is different from the number of wires then the wires and 1-bit processors are connected in such a way as to maximize the likelihood that good wires and good 1-bit processors may be connected.

Figure 8:
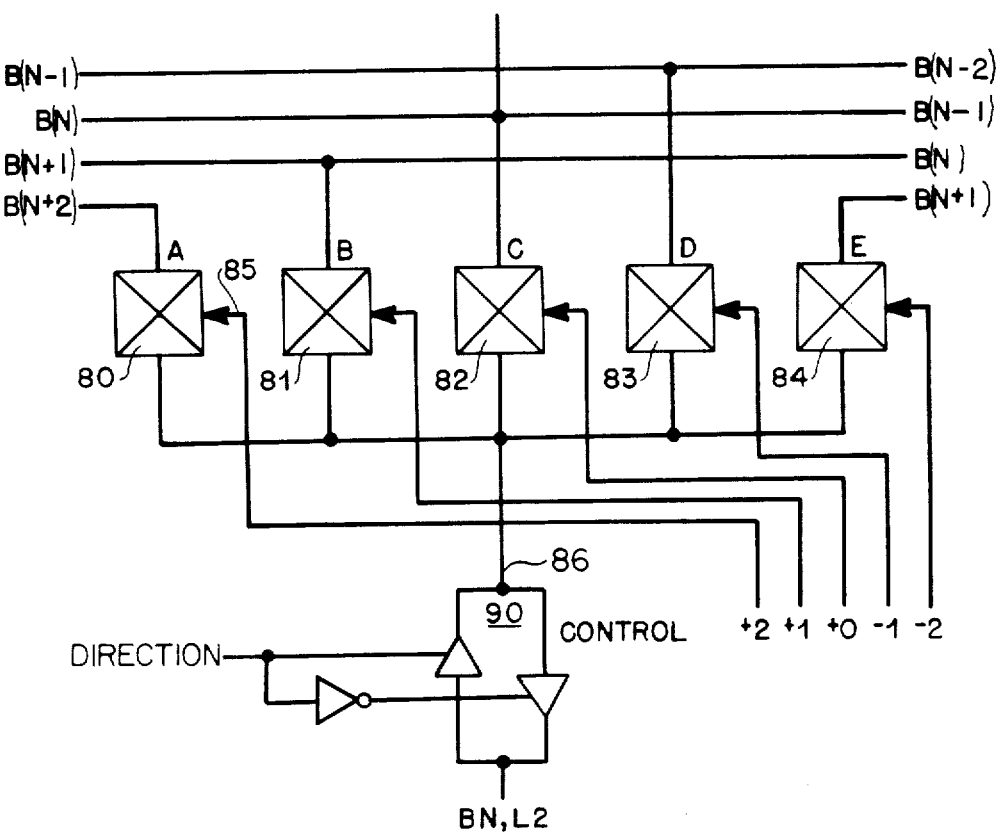
FIG. 8 is a block diagram of a bidirectional multiplexer or BIMUX employed in this invention.

As seen in FIG. 8, the BIMUX consists of five bidirectional switches A through E as 80 through 84. Any number of bidirectional switches may be so connected. Each bidirectional switch has a common lead which is connected to the terminal 86 of a buffer/receiver pair 90. Each switch is associated with a control input such as input 85 for switch 80. The control input determines which of the bidirectional devices will pass data to or from B N,L2. The bidirectional switches are typically transmission gates in CMOS design or pass transistors in NMOS design. Such bidirectional switches are well known and many examples of such switches exist in the prior art, and the specific choice of technology is not important.

Figure 11:
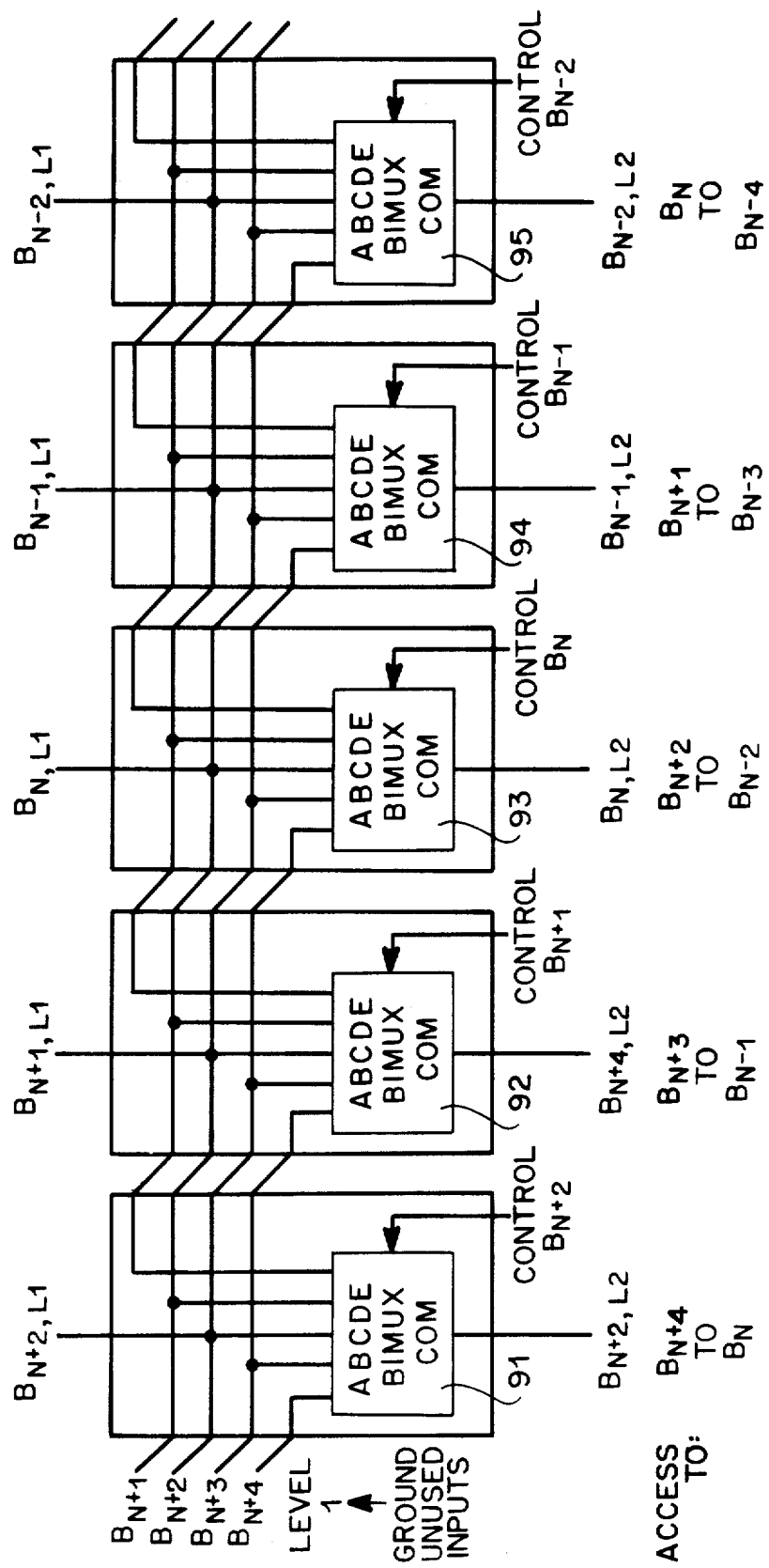
FIG. 11 is a block diagram showing a plurality of BIMUXes used in this invention.

FIG. 11 shows the regular way in which BIMUXes are interconnected. Five modules as those ih FIG. 8 are connected in this example. Each module as 91 to 95 contains five bidirectional switches as shown in FIG. 8. One can trace a wire such as B N,L1 it crosses through the five BIMUXes. The wire B N,L1 appears as a different input to each of the BIMUXes. Thus, B N,L1 is at input E for BIMUX module 91, input D for BIMUX module 92, input C for BIMUX module 93, input B for BIMUX module 94 and input A for BIMUX module 95.

Thus any one of the B(N+2), L2 to B(N−2),L2 lines may be connected to the B N,L1 line. The control lines to be activated thus depend upon the relative position of a 1-bit processor and the wire that the 1-bit processor is using. Hence, one can use the BIMUXes to bypass faulty cells and to avoid faulty wires. The choice of how many wires may connect to a 1-bit processor is determined by how many adjacent 1-bit processors are expected to be faulty. This is determined by the design and fabrication methods employed. The design shown in FIG. 9 allows any two adjacent 1-bit processors to be defective, but this can be altered by changing the number of inputs to a BIMUX. For example, when modules are connected to a common bus as in FIG. 2, one can minimize the extent of system reconfiguration due to a defective 1-bit processor. In order to do this, one has to localize the wire switching to the chip with the defect. This can be done after fabrication of the module by means of a diagnostic or testing routine. The good 1-bit processor in a particular chip configuration must reach around one or more defective 1-bit processors as can be explained for example with reference to FIG. 11. The BIMUXes in the defective cells are turned off so as not to interfere with good cells.

FIG. 9 shows the control logic. The selection of a transmission gate in a BIMUX is implemented by a register 110 which has five outputs designated as control B:+2, +1, +0, −1 and −2. These five outputs are the control inputs to the BIMUX module shown in FIG. 8. The register 110 receives control commands from programmable logic arrays (PLA) 111 and 112 which decode the data path instructions and cell selection, respectively. All cells decode the data path instructions in a like manner, but each cell has a unique selection code for the purpose of initialization. The register is coupled to a master reset line 113, clock 114, and to bit select lines. When a chip is to be reconfigured, all selection registers as register 110 are cleared using the master reset.

In this mode all 1-bit processors are disconnected from the B/R's to maximize the chance that a defective 1-bit processor will not interfere with its neighbors. Each 1-bit processor that is needed for calculation has its connections made by selecting it in turn using the cell select lines and by setting one bit in the selection register 110 by using the bit select lines. The choice of the bit in the selection register 110 determines which one of five pins is connected to a particular 1-bit processor. When the external system control logic determines that a 1-bit processor or interconnection has failed, the external control logic determines a new assignment of pins to processors. The external control logic then directs the selection registers in the affected processors to make the required assignments.

Accordingly, the assignment may be changed at will and is not merely a time of manufacturing operation. Hence, the provision of spare wires and the dynamic assignment of these wires to processing elements is extremely valuable in systems where high reliability is desired and/or where difficulties in manufacturing are encountered.

A bit in the register 110 is loaded when the following conditions are satisfied: (1) it is selected by Read/Write Address (2) the enable as is output by gate 115 is true, and clock is transmitted. The state of the bit is determined by the data line. The enable from gate 115 is true when a cell is selected, the proper instruction is decoded, and chip select is true.

In a system such as that shown in FIG. 7, with four reconfigurable paths, the following instructions occur after reset for each good cell in each chip:

1. Set the selected bit in the up reconfiguration register.
2. Set the selected bit in the down reconfiguration register.
3. Set the selected bit in the memory reconfiguration register.
4. Set the selected bit in the vertical bus reconfiguration register.

When a single wire fails, it is only necessary to set or clear the bits in the reconfiguration register in the cells that are affected.

As can be determined from the above, each of the four BIMUXes which is associated with the cell as shown in FIG. 6 is also associated with a separate register circuit as shown in FIG. 9. The cell selection logic is a decoder that provides a different selection code for each cell in a chip. For example, cell 0 is decoded as 0, cell 1 as 1 and so on. The chip select signal is required since the state of each reconfiguration register in each chip is presumably chip dependent. The system control selects each register in each cell in each chip and then loads the proper data.

Figure 12:
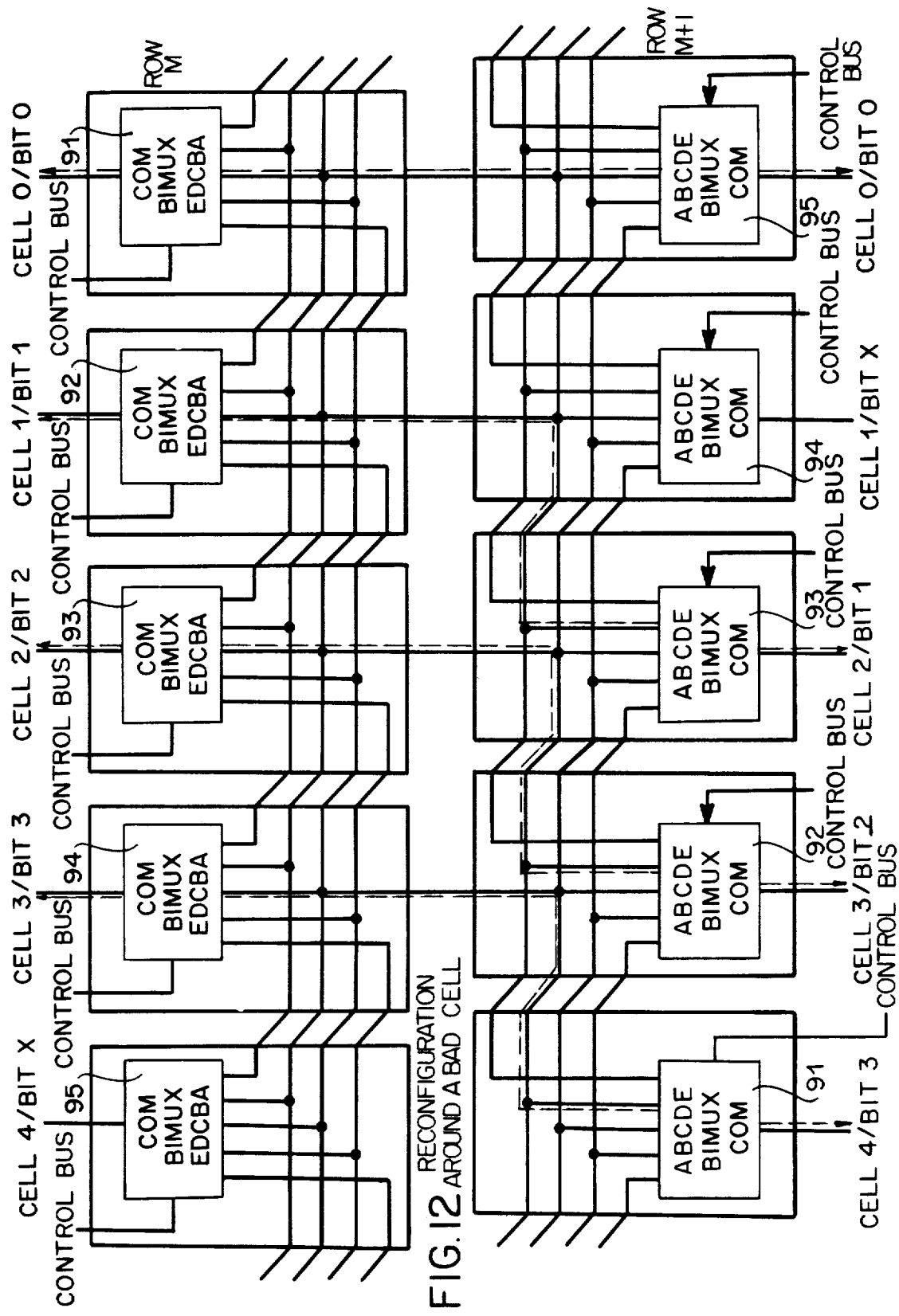
FIG. 12 is a block diagram showing a plurality of BIMUXes connected to bypass a defective cell.

FIG. 12 shows two rows of BIMUXes with no spare wires but one spare cell per row. The Figure shows in detail interconnections that are analogous to those shown in FIG. 3. Each cell has been reduced to a BIMUX for simplicity. One more column of cells than wires is provided. Cell 0 of row M and cell 0 of row M+1 are both good so connection C of the respective BIMUXes is used to connect the cells which carry bit 0. Cell 1 of row M is good but cell 1 of row M+1 is not; so cell 2 of row M+1 is used instead.

The former cell thus uses BIMUX input C and the latter uses input D to make the bit 1 connection. Likewise, cell 2 of row M and cell 3 of row M+1 are likewise configured carrying bit 3. Cell 1 of row M+1 is defective so its BIMUX is disconnected from all wires as is the BIMUX of cell 4 of row M since the cell is unused.

Figure 13:
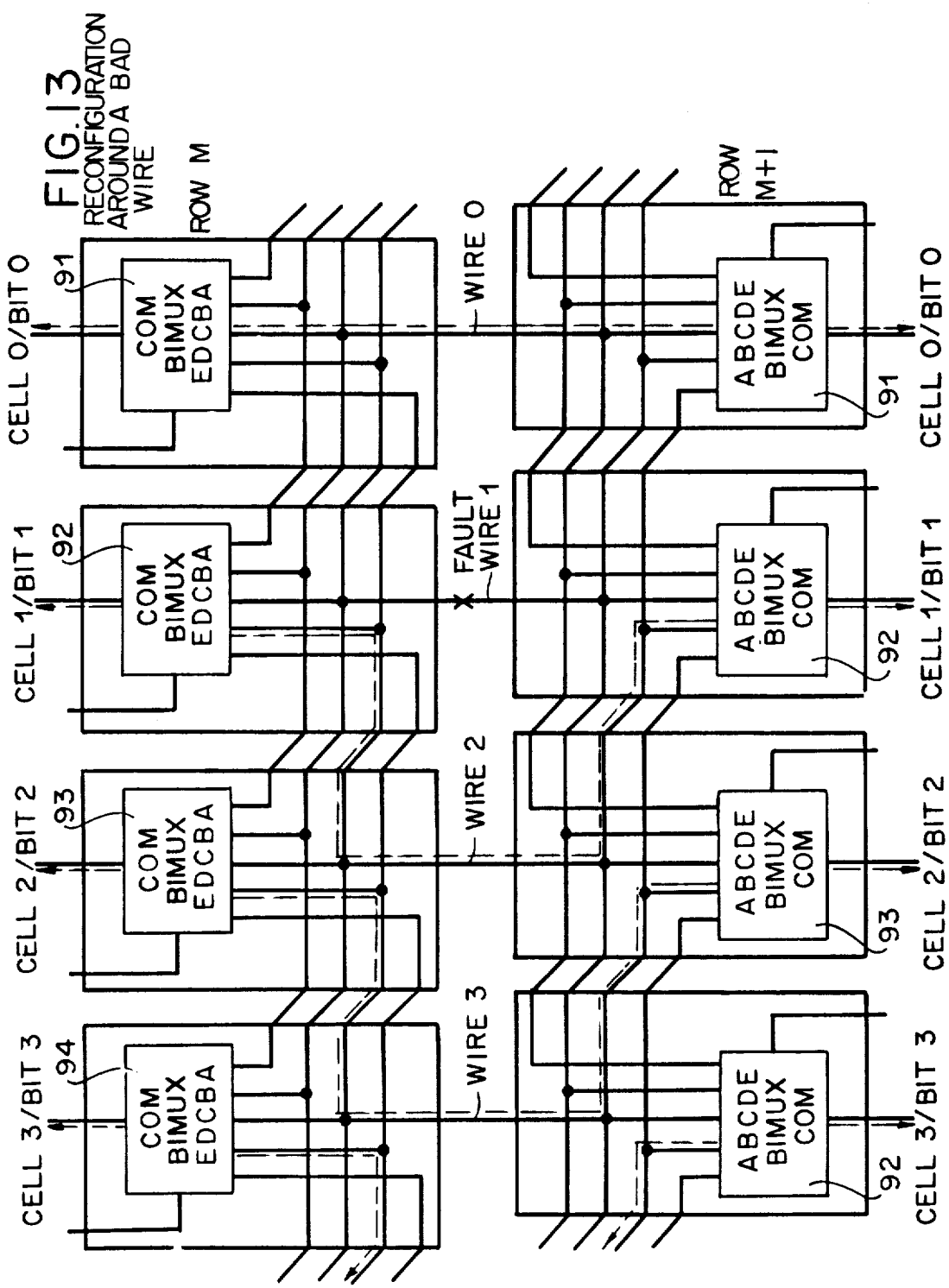
FIG. 13 is a block diagram showing a plurality of BIMUXes connected to bypass a defective wire.

FIG. 13 shows two rows of cells with one spare wire but no spare cells. This figure shows in detail the interconnections that are analogous to those in FIG. 4. Cell 0 of row M, cell 0 of row M+1, and wire 0 are all good, so BIMUX input C of both cells is used. Wire 1 is bad so all remaining cells must shift one wire to the left. Thus, BIMUX input D of cell 1 of row M and BIMUX input B of cell 1 of row M+1 are used.

Figure 14:
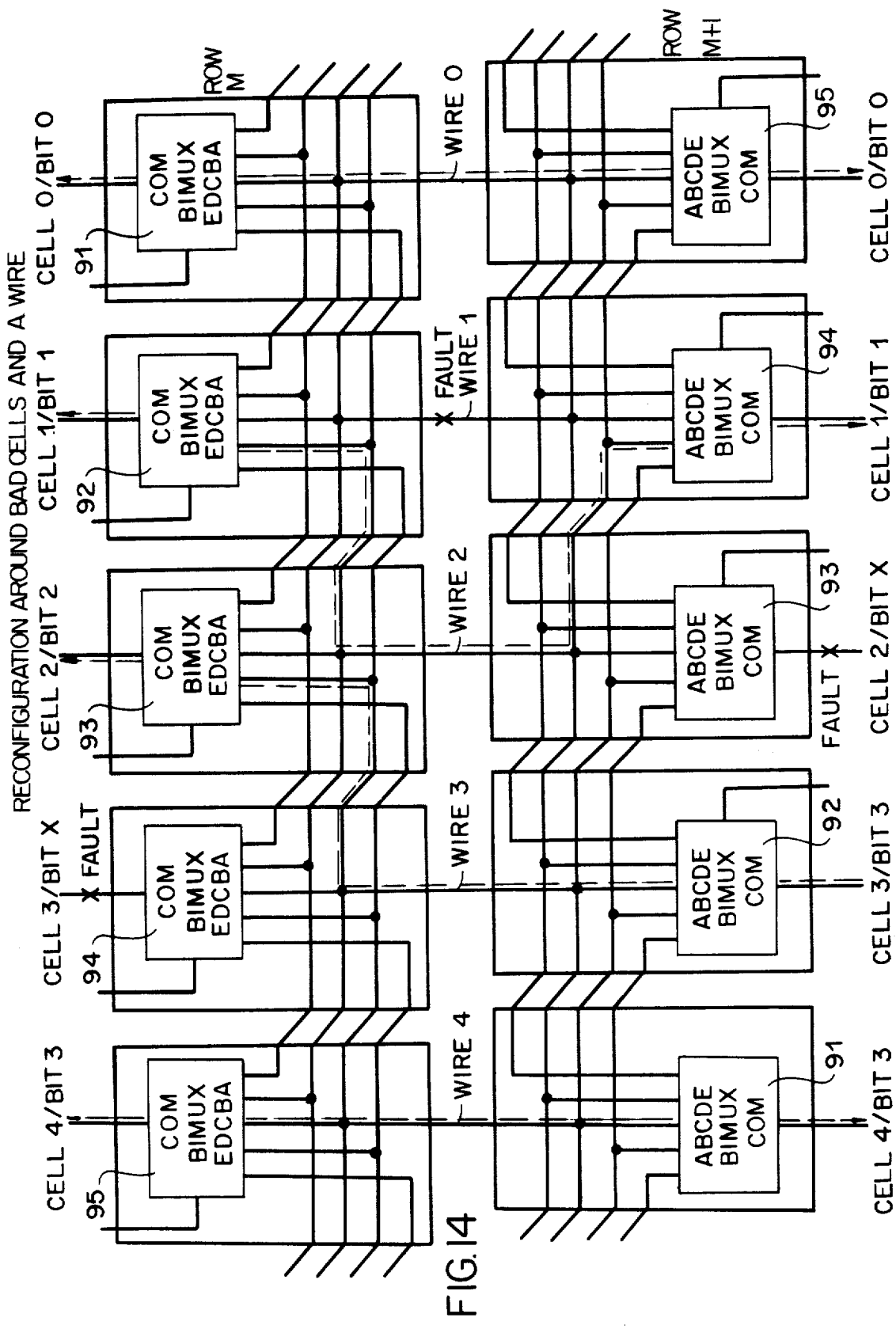
FIG. 14 is a block diagram showing a plurality of BIMUXes operative to bypass a defective cell and wire.

FIG. 14 shows two rows of cells with one spare cell and one spare wire in each row. This Figure shows in detail the interconnections that are analogous to those in FIG. 5. Cell 0 of row M, cell 0 of row M+1 and wire 0 are all good so BIMUX input C is used. Wire 1 is bad so cell 1 of row M and cell 1 of row M+1 shift one wire to the left to wire 2. Cell 1 of row M, BIMUX input D and cell 1 of row M+1, BIMUX input B are used. Cell 2 of row M+1 is bad so cell 2 of row M connects to cell 3 of row M+1 using wire 3.

The former uses BIMUX input D, the latter uses BIMUX input C. Cell 3 of row M is bad so cell 4 of row M connects to cell 4 of row M+1 using wire 4. Both use BIMUX input C.

Figure 15:
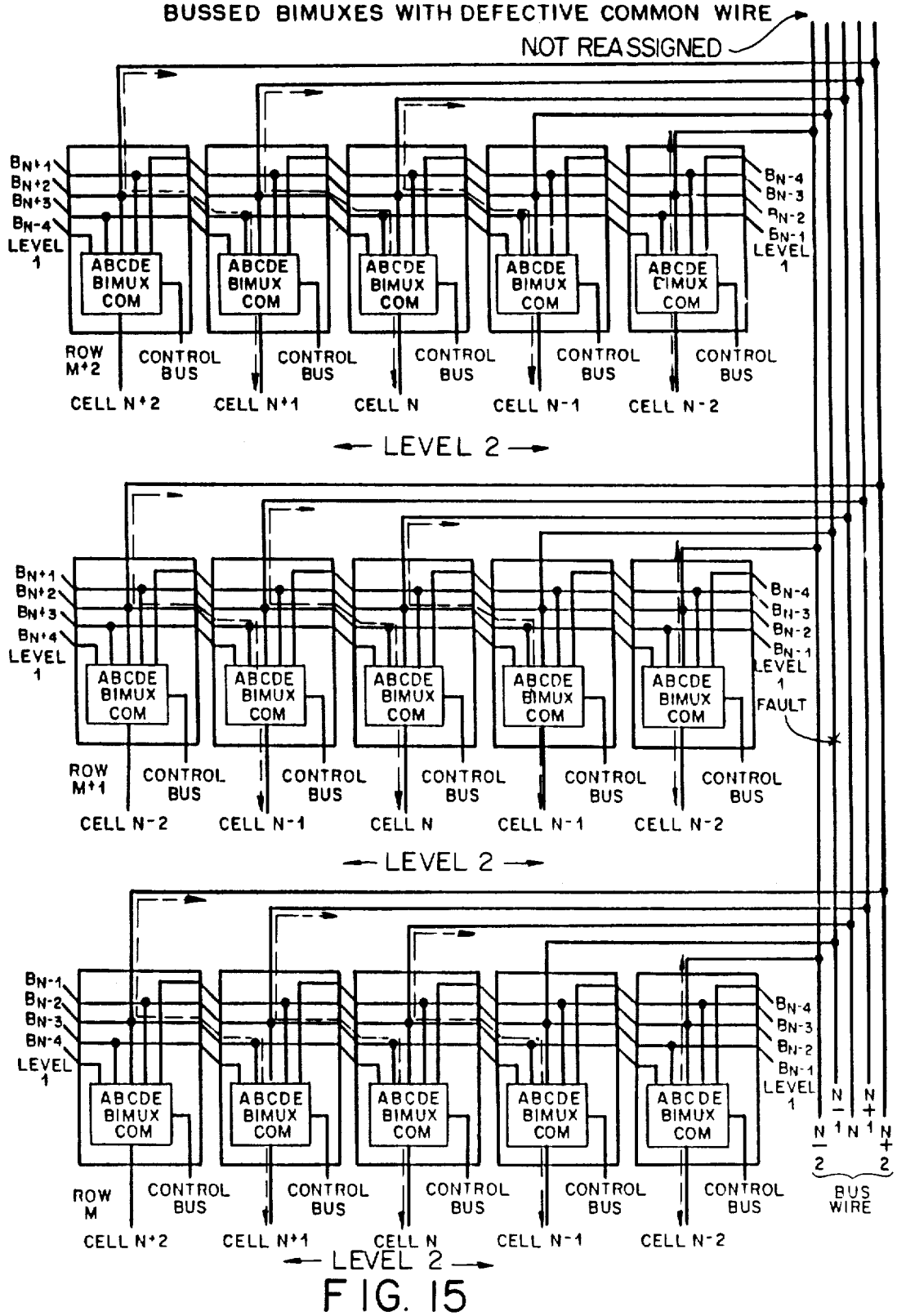
FIG. 15 is a block diagram showing a plurality of BIMUXes or cells arranged in a parallel configuration and operative to bypass defective cells and wires.

FIG. 15 shows three rows of five cells each connected in parallel. Spare wires and spare cells are provided. Assume that all cells are good and that a 4-bit word size is required. Also assume that one of the bus wires, bit N+2 is defective. All of the rows must reassign the bus wires to the cells since the rows communicate in parallel rather than in serial as in the previous Figures. Cells N−2, N−1 and N in each row all use BIMUX input C to access wires, N−2, N−1 and N, respectively, of the bus. Bus wire N+1 is defective, however, so its signal is reassigned to bus wire N+2. Cells N+1 in each row, therefore, use input B to access bus wire N+2. Cells N+2 are not needed, so they disconnect from the bus wires.

FIG. 16 shows a system block diagram in order to fully understand the operation of the array reconfiguration apparatus according to this invention. There are shown two modules as A, and B. Each module may be an array chip which must be configured to contain 16 active cells. Each cell of each array is associated with BIMUXes as shown in FIG. 7.

The system control 200 of FIG. 16 is shown in more detail in FIG. 17. Sixteen of the twenty wires of the Vertical Bus from the array are connected via an array chip to convert between the 20-bit array bus and the 16-bit system controller bus so that data may be transferred to and from the array. It is assumed that the system controller is built from conventional parts, other than the one array chip, and therefore cannot interface directly to the fault tolerant buses in the array. It is further assumed that one of the functions of the array chip is to provide a flow-through connection between Up and Down pins, via the various BIMUXes.

The system controller provides instructions common to parallel processors, as VECTOR ADD and VECTOR SUBTRACT, with data processing being done in the array.

Special instructions to control the reconfiguration logic have been added. These instructions are:
(1) CHIP SELECT
(2) CELL SELECT
(3) SELECT: Down, Up, Vertical Bus, or Memory
(4) RECONFIGURATION SET
(5) RECONFIGURATION CLEAR The operations are described along with FIG. 9, BIMUX Control Logic.

The instruction buses which are directed from the system control to the array modules are part of the instruction decode and execute logic which is typically a microinstruction ROM and a microprogram sequencer, such as an AMD 2910. As is common practice, the assembly language may also be stored in ROM, and the data in RAM.

Each array chip is associated with its own memory as 201 for array A, and 202 for array B. Each array chip as A and B is tested utilizing a conventional tester such as a Fairchild Sentry model 20 chip tester. The fault data is tabulated for transmittal to the system control that will incorporate those array chips.

For example, array chip A may have four bad 1-bit processors. This information may be loaded into a nonvolatile memory in the system control when the system is manufactured. The system control 200 has stored therein the wiring pattern for a completed processor module. Apart from designating proper modules, the test procedure also determines any inoperable connections regarding wires between the individual array chips A and B, and the one in FIG. 17.

Since control 200 essentially is a computer under program control and the method of implementing the program is according to the following description.

The locations of all bad wires on all chips are known and are found by conventional testing techniques. The assignments of good cells to good wires for all array chips and all buses are then found. The following requirements are imposed upon array chips used in this system.

1. The location of bad cells on each array chip is known. This is accomplished by testing each array chip in a conventional testing technique.
2. There are no bad pad drivers.
3. There are at least 16 good cells and no more than two adjacent bad cells per chip.

When an array chip is tested, these are the only criterion for accepting the chips.

Once the above information is ascertained, the following permanent data structures are required to solve the problem. The data structures can be incorporated in the system control memory. Thus for each array chip, an array of twenty records is required. There is one record per cell and each record contains the cell condition, whether the cell be good or bad; the cell activity, whether the cell is on or off; and the relative pin assignments as for example −2, −1, 0, +1, +2, disconnect.

This pin assignment is for each bus that the particular cell connects to. For each twenty bit bus which is the vertical bus, memory bus, and the up and down path between each pair of array chips, there is only required an array of twenty records, one record per bit of the bus where each record contains the condition of the bus as good, bad or unknown, and the availability of the bus as used, unused or blocked.

Once the above information is formulated and stored accordingly, the procedure is as follows. The first thing that is done is a set of cells is selected as well as a set of wires so that all array chips may be connected to the vertical bus. The selection procedure will be described following this description.

It is noted that since the vertical bus is common to all array chips, a single point failure affects all of the chips. This bus is therefore the least likely to be operational. After the above, one now assigns the selected vertical bus wires to the cells of all the array chips connected to it. Reconfiguration set and reconfiguration clear instructions are used for this purpose.

The next step is to test the vertical bus by loading data from the controller into all the array chips. This data is then read back from the array chips one after another into the controller. The test data includes repetitive patterns such as 0, 1, 0, 1 . . . and 1, 0, 1, 0. These patterns will assist in testing for shorts to ground or power opens or adjacent shorts.

Once the controller performs the above noted function for reading data from the array chips then the system controller by means of a diagnostic routine determines the location of any vertical bus faults. A common fault would affect all array chips whereas an open to a single chip would affect only that chip. This information is used to update the vertical bus record with the location of all the found defects. If defects are found then the procedure as described above is continued from the first step.

After the determination of the location of vertical bus faults, one now establishes the up/down connections between a pair of adjacent array chips. A set of wires is selected as well as a set of cells and is selected according to the procedure to be described. Then cells are assigned to the wires using the reconfiguration clear and reconfiguration set instructions. After this step, data from the vertical bus may be loaded from the controller into one array chip shipped over down to the other where it is read from "UP" and sent back to the controller. The transfer is reversed as a double check and then verified with the above described test patterns which emanate from the controller.

Next, the locations of any up/down faults are determined and the data is updated in memory. If there are errors then one returns to the step where the up/down connections are determined. Otherwise, up/down connections are then determined for the next untested pair.

The memories are pretested. Data is passed from the system controller to each array chip and then to memory. The process is reversed to verify that the data is received properly by the memory. If there are errors, new pin assignments are calculated.

After all this is done, the system is operational if all connections were made. Otherwise, one or more chips must be replaced or one or more wires must be repaired for the system to operate.

In regard to the above, it is noted that the above procedure selects good wires and good cells and makes the normal connections to the vertical bus while establishing the location of any vertical bus faults as well as any up/down connection difficulties. In regard to this then cells are assigned to the wires using the reconfiguration clear and reconfiguration set instructions.

As indicated above, a selection procedure is employed when one selects a set of cells and wires so that the array chips may be connected to the vertical bus. The selection procedure is also employed when the set of wires and cells are selected to establish the up/down connections between a pair of adjacent array chips. The procedure is as follows.

Figure 18:
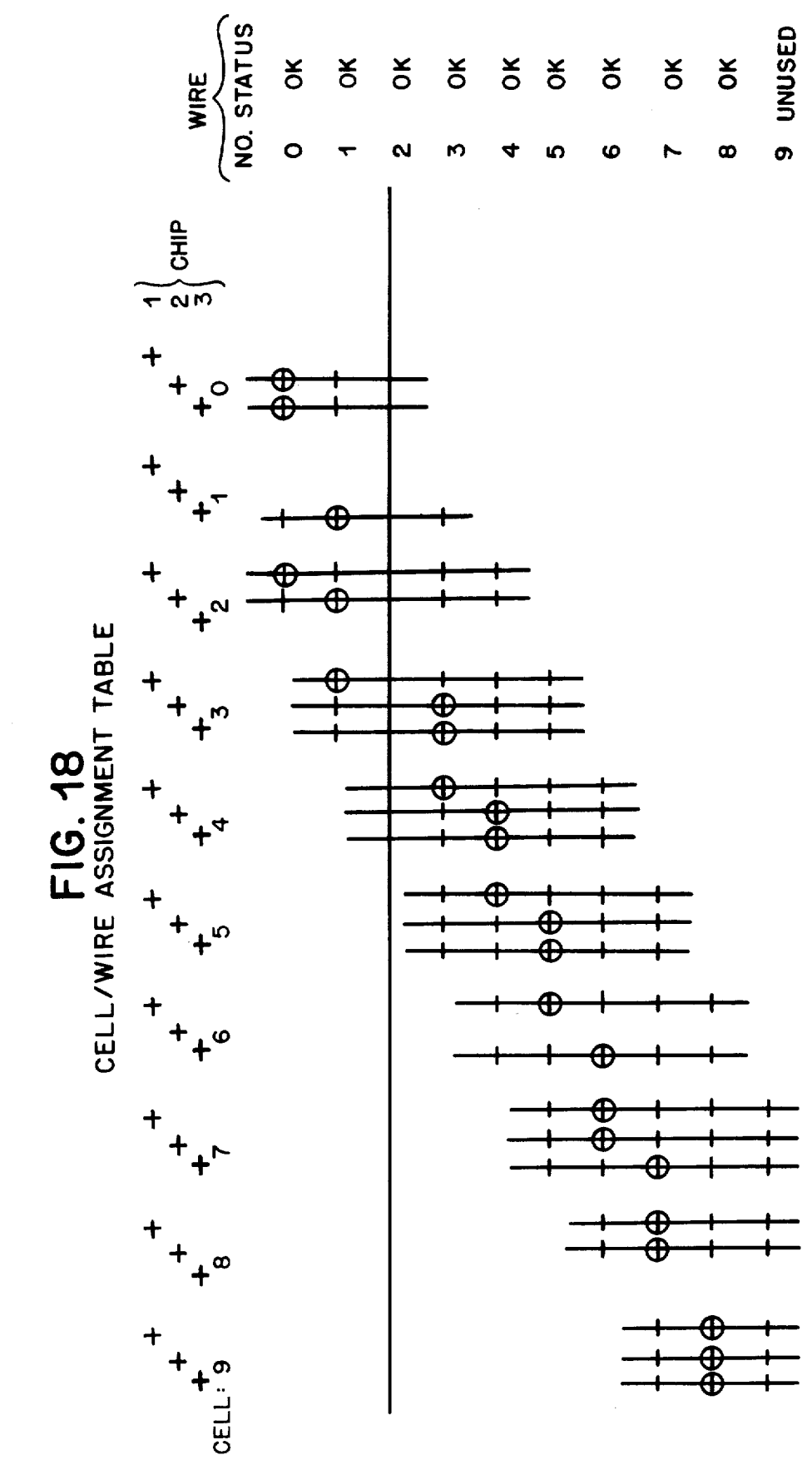

Essentially, the procedure is implemented by assigning cells to wires. The first thing that is done is that a chart is modeled basically which is a temporary data structure as shown in FIG. 18. A different chart is used for each bus. This example is for the vertical bus. The cell number is shown in the X dimension and the Y number is shown in the Y dimension. Ten cell and ten wire chips have been shown for simplicity, but any numbers that correspond to actual chips may be used. The cell wire assignment table is shown in FIG. 18. The wire condition or status is shown in FIG. 18 along with the wire number where the defects are shown by a capital X.

The cell condition is shown along with the cell number where there are as many columns for each cell as there are chips. Three chips have been shown for simplicity where the bad cells are shown by capital X and the good cells are shown by +. For each good cell of each chip place a + to show each of the wires it may connect to. Other spaces are left blank. This example assumes a total reach of five. Cell N may connect to wires N+2, N+1, N+0, N−1, and N−2. Negative wire numbers and wire numbers greater than or equal to the number of wires are not physical and are ignored. Thus three (on the ends) to five +'s are made for each good cell.

Draw a horizontal line through all potential connections to bad wires so that these cell/wire assignments will not be used.

For each wire N, starting with 0, for as many wires are needed, 8 in this example, temporarily select the lowest numbered, available, good cell of each chip that may connect to it. If all chips cannot connect to a wire because of the combination of defects then mark the wire "blocked" and move on to the next wire. When all chips can connect to a wire, draw a circle around a "+" to make an assignment, and draw a vertical line through all possible assignments of that cell so that the cell becomes unavailable for other connections. The good cells that are used are marked "On", and the good cells that are not used are marked "Off" (not shown for simplicity). If fewer than the required number of wires can be connected then the system may not be fully configured and an error is indicated.

After the system control has set up a functional processor by making the above noted connections, the processor is then tested to verify that the circuit is operating properly. If operation is defective, additional cells have presumably failed since the time of manufacture.

Diagnostics are run to isolate the defective cells. The identities of these cells are added to the current list of defective cells and another configuration utilizing additional spare cells is implemented. If there are no spare cells available in a given array chip, the system cannot be automatically repaired. Hence the system control knows where all defective cells as well as defective wires are and formulates an operable processor configuration by bypassing defective cells and defective wires.

Thus, according to the above noted procedures and instructions, one can now utilize circuit boards with defective wires and with VLSI integrated circuit chips which contain, for example, 25 percent defective components and wires. These chips can be employed to form an effective system configuration. The operation of the system is particularly suited for use with parallel processors or other highly regular structures. Each of the data wires, as indicated above, is associated with a B/R which in turn is associated with the BIMUX device which allows data flow in two directions. In this manner, as explained above, by using spare wires and spare components and by employing the dynamic assignment of these wires, one can achieve extremely high reliability even though the complexity of the structure is associated with low reliability.

What is claimed is:

1. Array configuration apparatus for use in reconfiguring large integrated circuit systems of the type including arrays of distinct logic circuits arranged in rows, with each row consisting of N identical circuits for connecting to N identical circuits in another row by means of bidirectional data lines, wherein in order to provide an operative array, there is required that connection be made between N-X operational circuits in one row and N-X operational circuits in the next row, with said connections being made by N-X data lines, where X is the number of defects plus unused spares and is a positive integer less than N and where N-X is the number of data bits to be coupled between said rows, comprising:
   first means operative to select N-X operational circuits in each of said rows,
   second means operative to select N-X operational data lines for connecting said rows to each other, and
   control means responsive to the selection of said first and second means to bidirectionally connect said N-X operational circuits in each row selected by said first means to one another via said N-X data lines selected by said second means to enable the bidirectional transfer of said N-X bits from row to row.

2. The array reconfiguration apparatus according to claim 1, wherein said control means includes a plurality of bidirectional buffer/receivers each separate one coupled to a separate data line to allow an associated data line to bidirectionally couple data, said buffer/receivers each having an input terminal and an output terminal, with the input terminal coupled to said data line,
   a given number of bidirectional multiplexing means each having an input and output terminal each capable of the bidirectional transmission of data between said terminals, each of said bidirectional multiplexing means having a control terminal for selecting one in said given number, with said input terminals of said bidirectional multiplexing means coupled together and connected to the output terminal of an associated buffer/receiver and with the output terminals of said bidirectional multiplexing means each separately coupled to one associated selected data line, and
   control logic means coupled to said control terminals of said bidirectional multiplexing means and operative to select any one of said given number of bidirectional multiplexing means to thereby direct said associated selected data line between selected associated circuits in each of said rows.

3. The apparatus according to claim 2, wherein said control logic means includes a register capable of providing any one of said given number of outputs for selecting any one of said bidirectional multiplexing means, and decoder means coupled to said register means for selecting any one of said outputs, said decoder means responsive to control signals from said control logic means for accessing said register.

4. Array reconfiguration apparatus for use in reconfiguring large integrated circuit systems of the type including arrays of distinct logic circuits, each of said arrays of distinct logic circuits being characterized in having a plurality of identical circuit structures necessary to perform given arithmetic operations with said plurality of circuit structures in each array having input and output data lines for coupling to other circuit structures in said array with said array further characterized in that a given number N of identical circuit structures is neccessary to form an operative array and that a given number of data lines are necessary to couple said structures within said arrays, said arrays being formed so that each structure contains an excess M of identical circuit structures, with an excess X of data lines, where M and X are positive integers and are selected in accordance with the reliability associated with fabricating said array by integrated circuit techniques, comprising:

a plurality of bidirectional buffer/receivers each separate one coupled to a separate input and output data line to allow said associated line to receive or transmit data, said bidirectional buffer/receivers each having an input terminal and an output terminal, with the input terminal coupled to said data line, a plurality of bidirectional buffer/receivers each separate one coupled to a separate input and output data line to allow said associated line to receive or transmit data, said bidirectional buffer/receivers each having an input terminal and an output terminal, with the input terminal coupled to said data line, a given number of bidirectional multiplexing means each having an input and output terminal each capable of the bidirectional transmission of data between said terminals, each of said bidirectional multiplexing means having a control terminal for selecting any one in said given number, with said input terminals of said bidirectional multiplexing means coupled together and connected to the output terminal of an associated buffer receiver and with the output terminals of said bidirectional multiplexing means each separately coupled to one associated excess data line, and control logic means coupled to said control terminals of said bidirectional multiplexing means and operative to select any one of said given number of bidirectional multiplexing means to thereby direct said associated data line to any one of said associated excess data lines, whereby said excess data lines can transmit data to said other identical circuit configurations when selected.

5. The array reconfiguration apparatus according to claim 4, wherein said array is an associative processor array with each of said identical circuit structures being a 1-bit processor.

6. The array reconfiguration apparatus according to claim 5, further including means coupled to each of said associate processor arrays for storing therein data indicative of the operating capability of each of said identical circuits in said array to thereby store data indicative of which ones of said N+M circuit structures are defective and means included in said control logic means for bypassing said defective circuit structures by connecting other circuit structures to said excess data lines.

7. The apparatus according to claim 4, wherein said given number of bidirectional multiplexing means is equal to X+1, whereby if there are four spare data lines the number of bimultiplexing means is equal to five.

8. The apparatus according to claim 4, wherein said control logic means includes a memory operative to store therein data indicative of the operating capability of each of said identical circuit structures, with said data indicative of which of said structures are inoperable to thereby permit said control logic means to couple operable structures to said excess data lines, to form an operative array.

9. The apparatus according to claim 7, wherein said bidirectional multiplexing means comprises X+1 bidirectional switches with each of said switches having an input and an output terminal with the input terminals of said switches connected together, with the output terminal of X switches each connected to a separate one of said spare data lines and with the output terminal of said other switch connected to a system data line, wherein said system data line can be rerouted via any other one of said switches.

10. The apparatus according to claim 4, wherein each of said buffer/receivers includes a first amplifier having an input coupled to an input data line and an output coupled to an output data line, with a second amplifier in parallel with said first and having an input coupled to said output data line and an output coupled to said input data line, with each of said amplifiers having another input coupled to a source of data, and a resistor coupled to the output of said second amplifier for providing a given logic level at said output of said amplifier indicative of an opened data lead.

11. The apparatus according to claim 4, wherein said control logic means includes a register capable of providing any one of said given number of outputs for selecting any one of said bimultiplexing means, and decoder means coupled to said register means for selecting any one of said outputs, said decoder means responsive to control signals from said control logic means for accessing said register.

12. The apparatus according to claim 11, wherein said register provides X+1 outputs.

13. A method of reconfiguring large integrated circuit systems, of the type including arrays of distinct logic circuits, each of said array circuits characterized in having a plurality of identical circuit structures necessary to perform given arithmetic operations with said plurality of circuit structures in each array having input and output data lines for coupling to other circuit structures in said array, with said array further characterized in that a given number N of said identical circuit structures are necessary to form an operative array and that a given number of data lines M are necessary to couple said structures within said array, comprising the steps of:

forming each of said arrays with N+X circuit structures, where X is a positive integer less than N, forming each of said arrays to include Y additional data lines whereby said data lines are equal to M+Y, selecting N operable circuit structures in each of said arrays, selecting M operable data lines in each of said array, connecting the N selected circuit structures to said M selected data lines to form an operative array.

14. The method according to claim 3, wherein said large integrated circuit system is an associative processor, with each of said arrays including N+X identical processor units with each processor unit associated with M+Y data lines.

15. The method according to claim 13, further including the step of storing data indicative of the operating capability of each of said circuit structures for determining which are operable and which are not operable.

16. The method according to claim 15, further including the step of storing data indicative of the operating capability of each of said data lines for determining which are operable and which are not.

17. The method according to claim 15, wherein the step of selecting said circuit structures is implemented according to said stored data.

18. The method according to claim 16, wherein the step of selecting said data lines is implemented according to said stored data.

19. The method according to claim 15, including storing said data in a memory.

20. The method according to claim 15, including the step of transferring said stored data to a central memory associated with a computer for selecting said circuit structures.

21. The method according to claim 16, including the step of transferring said stored data to a central memory associated with a computer for selecting said data lines.

22. The method according to claim 13, further including the step of connecting said spare data lines to a bidirectional multiplexer to enable any one of said spare data lines to be selected.

* * * * *